(12) United States Patent
Lin

(10) Patent No.: US 11,742,748 B1
(45) Date of Patent: Aug. 29, 2023

(54) ELECTRONIC DEVICE AND PROTECTION METHOD THEREOF

(71) Applicant: Qisda Corporation, Taoyuan (TW)

(72) Inventor: Meng-Hsien Lin, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/828,106

(22) Filed: May 31, 2022

(30) Foreign Application Priority Data

Apr. 8, 2022 (CN) .......................... 202210367934.3

(51) Int. Cl.
*H02M 1/32* (2007.01)
*H02M 3/158* (2006.01)
*H03K 17/22* (2006.01)

(52) U.S. Cl.
CPC ............. *H02M 1/32* (2013.01); *H02M 3/158* (2013.01); *H03K 17/223* (2013.01)

(58) Field of Classification Search
None
See application file for complete search history.

(56) References Cited

U.S. PATENT DOCUMENTS

| 7,669,065 B2* | 2/2010 | Pan | H02J 13/00036 327/365 |
| 8,117,465 B2* | 2/2012 | Wu | H04W 52/38 714/24 |
| 9,329,210 B1* | 5/2016 | Gupta | G05F 3/02 |

* cited by examiner

*Primary Examiner* — Jeffery S Zweizig

(57) ABSTRACT

An electronic device including a voltage detection circuit, a control and protection circuit, at least one voltage converter, and a system-on-chip is provided. The voltage detection circuit detects a voltage source to output a voltage detection signal. The control and protection circuit, coupled to the voltage detection circuit, generates a system power enabling signal according to the voltage detection signal. The at least one voltage converter, coupled to the control and protection circuit, generates a system power signal according to the system power enabling signal. The system-on-chip, coupled to the at least one voltage converter, controls the electronic device when receiving the system power signal. In response to a power off signal generated from the system-on-chip, the control and protection circuit further isolates the voltage detection signal to avoid the transition of the voltage detection signal affecting a system shutdown procedure of the electronic device.

20 Claims, 3 Drawing Sheets

ELECTRONIC DEVICE AND PROTECTION METHOD THEREOF

This application claims the benefit of People's Republic of China application Serial No. 202210367934.3, filed Apr. 8, 2022, the subject matter of which is incorporated herein by reference.

BACKGROUND OF THE INVENTION

Field of the Invention

The invention relates in general to an electronic device and a protection method thereof.

Description of the Related Art

Petrol vehicles, electric vehicles or hybrid vehicles are indispensable to modern people in their daily life. Normally, a vehicle may have several vehicle products such as digital video recorder (DVR). A DVR can record the journey and provide evidence to facilitate the attribution of responsibility in a driving accident.

Generally speaking, power variation is an important item in the verification test of a vehicle product. Through the test of instantaneous power interruption waveform, a normal operation of the system of the entire product can be assured.

Therefore, it has become a prominent task for the industries to provide an electronic device and a protection method thereof capable of resisting instantaneous power interruption of a vehicle product to assure a normal operation of the system of the entire product.

SUMMARY OF THE INVENTION

According to one embodiment of the present invention, an electronic device is provided. The electronic device includes a voltage detection circuit, a control and protection circuit, at least one voltage converter, and a system-on-chip. The voltage detection circuit is configured to detect a voltage source to output a voltage detection signal. The control and protection circuit is coupled to the voltage detection circuit and configured to generate a system power enabling signal according to the voltage detection signal. The at least one voltage converter is coupled to the control and protection circuit, wherein the at least one voltage converter generates a system power signal according to the system power enabling signal. The system-on-chip is coupled to the at least one voltage converter, wherein the system-on-chip, when receiving the system power signal generated by the at least one voltage converter, controls the electronic device. In response to a power off signal generated from the system-on-chip, the control and protection circuit further isolates the voltage detection signal to avoid the transition of the voltage detection signal affecting a system shutdown procedure of the electronic device.

According to another embodiment of the present invention, a protection method of an electronic device is provided. The protection method includes: detecting a voltage source to output a voltage detection signal; generating a system power enabling signal according to the voltage detection signal; generating a system power signal according to the system power enabling signal; and controlling the electronic device in response to the system power signal. In response to a power off signal, the voltage detection signal is isolated to avoid the transition of the voltage detection signal affecting a system shutdown procedure of the electronic device.

The above and other aspects of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to the prior art used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

Figure 1:
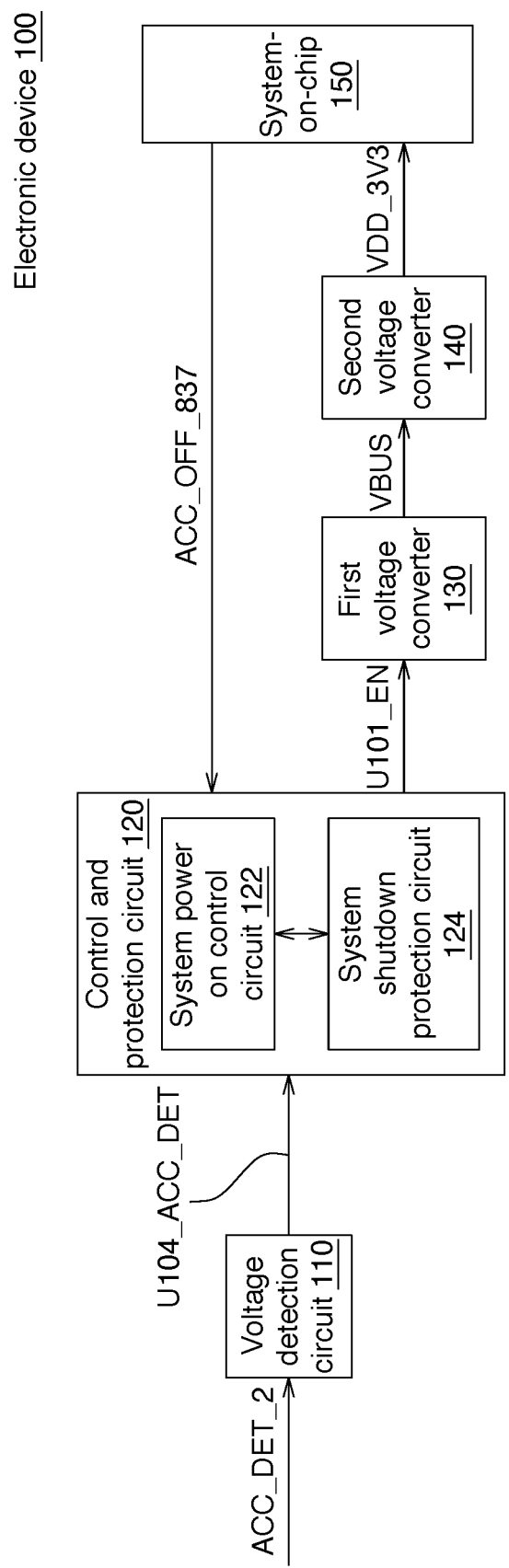
FIG. 1 is a functional block diagram of an electronic device according to an embodiment of the present disclosure.

Referring to FIG. 1, a functional block diagram of an electronic device according to an embodiment of the present disclosure is shown. As indicated in FIG. 1, the electronic device 100 according to an embodiment of the present disclosure includes a voltage detection circuit 110, a control and protection circuit 120, a first voltage converter 130, a second voltage converter 140, and a system-on-chip 150. The electronic device 100 according to an embodiment of the present disclosure can be realized by, for example but not limited to, such as a digital video recorder (DVR).

The voltage detection circuit 110 is configured to detect a voltage source ACC_DET_2 to output a voltage detection signal U104_ACC_DET. In an embodiment of the present disclosure, exemplarily but not restrictively, the voltage source ACC is 6.2V. The voltage source ACC_DET_2 can be, for example but not limited to, a cigarette lighter at a vehicle.

The control and protection circuit 120 is coupled to the voltage detection circuit 110 and is configured to determine whether to provide electricity to other elements inside the electronic device 100. The control and protection circuit 120 includes a system power on control circuit 122 and a system shutdown protection circuit 124.

The system power on control circuit 122 is coupled to the voltage detection circuit 110 to generate a system power enabling signal U101_EN according to the voltage detection signal U104_ACC_DET.

The system shutdown protection circuit 124 is coupled to the system power on control circuit 122 and is configured to isolate the voltage detection signal U104_ACC_DET to avoid the transition of the voltage detection signal U104_ACC_DET affecting a system shutdown procedure of the electronic device 100.

The first voltage converter 130 is coupled to the control and protection circuit 120 and receives the system power enabling signal U101_EN to generate a system bus voltage VBUS. In an embodiment of the present disclosure, the first voltage converter 130 can be realized by, for example but not limited to, such as a DC/DC converter.

The second voltage converter 140 is coupled to the first voltage converter 130 and receives a system bus voltage VBUS to generate a system power signal VDD_3V3. In an embodiment of the present disclosure, the second voltage converter 140 can be realized by, for example but not limited to, such as a DC/DC converter.

The system-on-chip 150 is coupled to the second voltage converter 140. When receiving the system power signal VDD_3V3 generated by the second voltage converter 140, the system-on-chip 150 controls the electronic device 100.

When performing the system shutdown procedure, the system-on-chip 150 generates a power off signal ACC_OFF_837 to the control and protection circuit 120. In response to the power off signal ACC_OFF_837 generated from the system-on-chip 150, the control and protection circuit 120 isolates the voltage detection signal U104_ACC_DET to avoid the transition of the voltage detection signal U104_ACC_DET affecting a system shutdown procedure of the electronic device 100.

Figure 2:
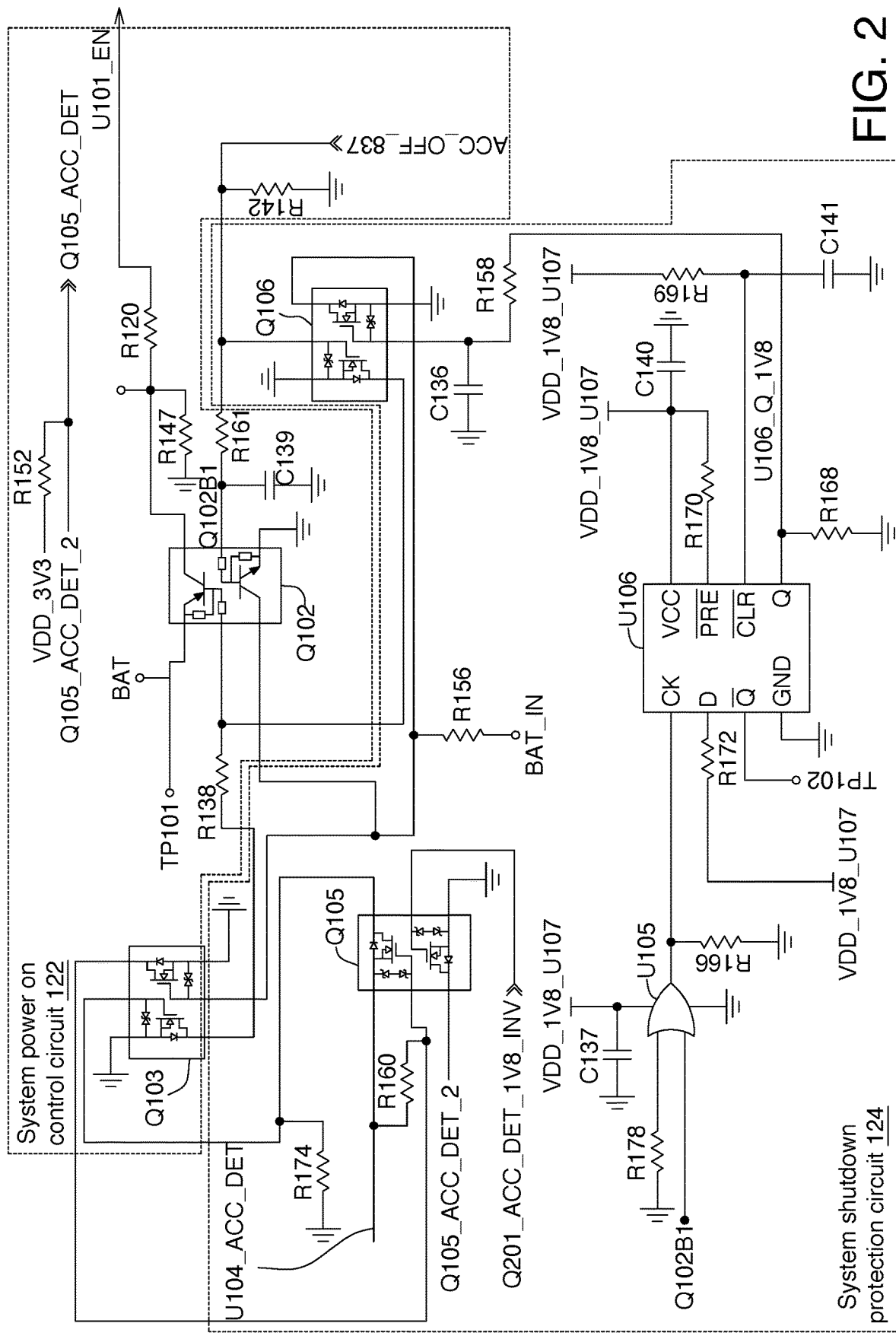
FIG. 2 is a detailed circuit diagram of a system power on control circuit and a system shutdown protection circuit according to an embodiment of the present disclosure.

FIG. 2 is a detailed circuit diagram of the system power on control circuit 122 and the system shutdown protection circuit 124 according to an embodiment of the present disclosure.

The system power on control circuit 122 includes a first switch Q102, a second switch Q103, 6 resistors R152, R120, R147, R161, R138, and R142, and a capacitor C139. The first switch Q102 and the second switch Q103 can be realized by, for example but not limited to, such as an MOSFET.

The resistor R152 is coupled between the signal VDD_3V3 and the signal Q105_ACC_DET2.

The resistor R120 is coupled between the first switch Q102 and the signal U101_EN.

The resistor R147 is coupled between the first switch Q102 and the ground end.

The resistor R161 is coupled between the first switch Q102 and the capacitor C139.

The resistor R138 is coupled between the first switch Q102 and the second switch Q103.

The resistor R142 is coupled between the first switch Q102 and the ground end.

The capacitor C139 is coupled between the first switch Q102 and the ground end.

The system shutdown protection circuit 124 includes: a third switch Q105, a fourth switch Q106, a logic gate U105, a latch unit U106, 10 resistors R168, R156, R158, R174, R160, R169, R170, R172, R166, and R178, and 4 capacitors C136, C140, C141, and C137. The third switch Q105 and the fourth switch Q106 can be realized by, for example but not limited to, such as an MOSFET.

Each of the first switch Q102, the second switch Q103, the third switch Q105 and the fourth switch Q106 has 6 pins.

The logic gate U105 has 2 input ends and an output end. The logic gate U105 can be realized by, for example but not limited to, such as an OR logic gate.

The latch unit U106 has 8 pins. The latch unit U106 can be realized by, for example but not limited to, such as a D-type flip-flop.

The resistor R156 is coupled between the second switch Q103 and the signal BAT_IN.

The resistor R158 is coupled between the latch unit U106 and the capacitor C136.

The resistor R168 is coupled between the latch unit U106 and the ground end.

The resistor R174 is coupled between the third switch Q105 and the ground end.

The resistor R160 is coupled between the third switch Q105 and the signal U104_ACC_DET.

The resistor R169 is coupled between the latch unit U106 and the signal VDD_1V8_U107.

The resistor R170 is coupled between the latch unit U106 and the signal VDD_1V8_U107.

The resistor R172 is coupled between the output end of the logic gate U105 and the signal VDD_1V8_U107.

The resistor R166 is coupled between the output end of the logic gate U105 and the ground end.

The resistor R178 is coupled between an input end of the logic gate U105 and the ground end.

The capacitor C136 is coupled between the fourth switch Q106 and the ground end. The resistor R158 and the capacitor C136 form an RC delay effect.

The capacitor C140 is coupled between the signal VDD_1V8_U107 and the ground end.

The capacitor C141 is coupled between the resistor R169 and the ground end.

The capacitor C137 is coupled between the logic gate U105 and the ground end.

Figure 3:
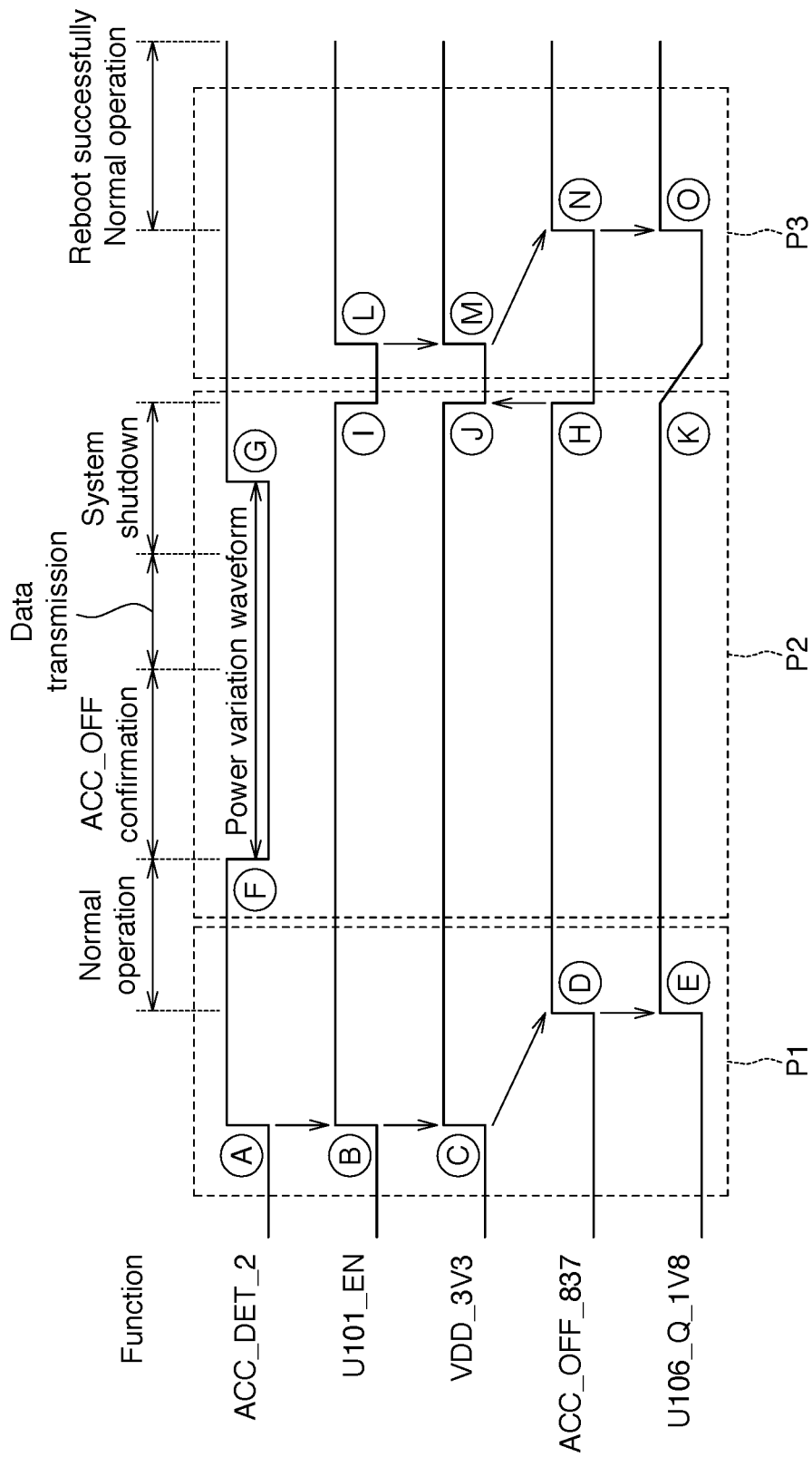
FIG. 3 is a signal waveform diagram of an electronic device according to an embodiment of the present disclosure.

FIG. 3 is a signal waveform diagram of an electronic device 100 according to an embodiment of the present disclosure. During the first stage P1, at time point A, the voltage source ACC_DET_2 is transitioned from logic low to logic high, so that the voltage source ACC_DET_2 detected by the voltage detection circuit 110 is logic high and the voltage detection circuit 110 outputs a logic high voltage detection signal U104_ACC_DET. At time point B, the system power on control circuit 122 generates a logic high system power enabling signal U101_EN according to the logic high voltage detection signal U104_ACC_DET. At time point C, the second voltage converter 140 generates a logic high system power signal VDD_3V3 to the system-on-chip 150, so that the electronic device 100 can perform a normal operation.

At time point D, the system-on-chip 150 generates a logic high power off signal ACC_OFF_837 to the control and protection circuit 120; in response to the power off signal ACC_OFF_837 generated from the system-on-chip 150, the control and protection circuit 120 isolates the voltage detection signal U104_ACC_DET to avoid the transition of the voltage detection signal U104_ACC_DET affecting a system shutdown procedure of the electronic device 100.

At time point E, in response to the logic high power off signal ACC_OFF_837 generated from the system-on-chip 150, the control and protection circuit 120 generates a logic high control signal U106_Q_1V8.

During the second stage P2, at time point F, the voltage source ACC_DET_2 is transitioned from logic high to logic low. During the period when the voltage source ACC_DET_2 is at a logic low state, the power off state can be checked (exemplarily but not restrictively, whether the voltage source ACC_DET_2 is at a logic low state for at least 2.5 seconds); and, data transmission can be performed (exemplarily but not restrictively, data transmission is performed for at least 2.5 seconds).

At time point G, the electronic device 100 is re-boosted, and the voltage source ACC_DET_2 is transitioned from logic low to logic high.

At time point H, when the shutdown procedure is completed, the system-on-chip 150 transitions the power off signal ACC_OFF_837 from logic high to logic low.

At time point I, in response to the power off signal ACC_OFF_837 transitioned from logic high to logic low, the control and protection circuit 120 transitions the system power enabling signal U101_EN from logic high to logic low.

At time point J, in response to the system power enabling signal U101_EN transitioned from logic high to logic low, the second voltage converter 140 transitions the system power signal VDD_3V3 from logic high to logic low.

At time point K, the logic high control signal U106_Q_1V8 generated by the control and protection circuit 120 is RC discharged and then is gradually discharged to logic low.

During the third stage P3, at time point L, when the control signal U106_Q_1V8 is discharged to logic low, the control and protection circuit 120 transitions the system power enabling signal U101_EN from logic low to logic high.

At time point M, in response to the system power enabling signal U101_EN transitioned from logic low to logic high, the second voltage converter 140 transitions the system power signal VDD_3V3 from logic low to logic high.

At time point N, the system-on-chip 150 transitions the power off signal ACC_OFF_837 from logic low to logic high.

At time point O, in response to the power off signal ACC_OFF_837 transitioned from logic low to the logic high, the control signal U106_Q_1V8 generated by the control and protection circuit 120 is transitioned from logic low to logic high. As the control signal U106_Q_1V8 generated by the control and protection circuit 120 is transitioned from logic low to logic high, this indicates that the electronic device 100 is successfully boosted and can operate normally.

As disclosed above, the electronic product and the protection method thereof according to an embodiment of the present disclosure can resist instantaneous power interruption and assure a normal operation of the system of the entire electronic product.

In an embodiment of the present disclosure, the power interruption waveform does not cause abnormal shutdown to the system, therefore the system can be re-boosted later and can resist instantaneous power interruption.

Additionally, one embodiment of the present invention can avoid power interruption without increasing extra software complexity or increasing/decreasing the required shutdown time, and the overall cost can be well controlled.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a voltage detection circuit configured to detect a voltage source to output a voltage detection signal;
   a control and protection circuit coupled to the voltage detection circuit and configured to generate a system power enabling signal according to the voltage detection signal;
   at least one voltage converter coupled to the control and protection circuit, wherein the at least one voltage converter generates a system power signal according to the system power enabling signal; and
   a system-on-chip coupled to the at least one voltage converter, wherein the system-on-chip, when receiving the system power signal generated by the at least one voltage converter, controls the electronic device,
   wherein,
   in response to a power off signal generated from the system-on-chip, the control and protection circuit further isolates the voltage detection signal to avoid transition of the voltage detection signal affecting a system shutdown procedure of the electronic device.

2. The electronic device according to claim 1, wherein, when performing the system shutdown procedure, the system-on-chip generates the power off signal to the control and protection circuit;
   in response to the power off signal generated from the system-on-chip, the control and protection circuit isolates the voltage detection signal to avoid the transition of the voltage detection signal affecting the system shutdown procedure of the electronic device.

3. The electronic device according to claim 2, wherein, the control and protection circuit comprises:
   a system power on control circuit coupled to the voltage detection circuit and configured to generate the system power enabling signal according to the voltage detection signal.

4. The electronic device according to claim 3, wherein, the control and protection circuit further comprises:
   a system shutdown protection circuit coupled to the system power on control circuit and configured to isolate the voltage detection signal to avoid the transition of the voltage detection signal affecting the system shutdown procedure of the electronic device.

5. The electronic device according to claim 1, wherein, the at least one voltage converter comprises:
   a first voltage converter coupled to the control and protection circuit, wherein the first voltage converter receives the system power enabling signal to generate a system bus voltage.

6. The electronic device according to claim 5, wherein, the at least one voltage converter further comprises:
   a second voltage converter coupled to the first voltage converter, wherein the second voltage converter receives the system bus voltage to generate the system power signal.

7. The electronic device according to claim 1, wherein, during a first stage,
   at a first time point, the voltage source is transitioned from logic low to logic high, so that the voltage detection circuit outputs the logic high voltage detection signal;
   at a second time point, the control and protection circuit generates a logic high system power enabling signal according to the logic high voltage detection signal;
   at a third time point, the at least one voltage converter generates the logic high system power signal to the system-on-chip, so that the electronic device can perform a normal operation;
   at a fourth time point, the system-on-chip generates a logic high power off signal to the control and protection circuit; in response to the power off signal generated from the system-on-chip, the control and protection circuit isolates the voltage detection signal to avoid the transition of the voltage detection signal affecting the system shutdown procedure of the electronic device; and
   at a fifth time point, in response to the logic high power off signal generated from the system-on-chip, the control and protection circuit generates a logic high control signal.

8. The electronic device according to claim 7, wherein, during a second stage,
- at a sixth time point, the voltage source is transitioned from logic high to logic low;
- at a seventh time point, the voltage source is transitioned from logic low to logic high;
- at an eighth time point, when the system shutdown procedure is completed, the system-on-chip transitions the power off signal from logic high to logic low;
- at a ninth time point, in response to the power off signal transitioned from logic high to logic low, the control and protection circuit transitions the system power enabling signal from logic high to logic low;
- at a tenth time point, in response to the system power enabling signal transitioned from logic high to logic low, the at least one voltage converter transitions the system power signal from logic high to logic low; and
- at an eleventh time point, the logic high control signal generated by the control and protection circuit is gradually discharged to logic low.

9. The electronic device according to claim 8, wherein, during a third stage,
- at a twelfth time point, when the control signal is discharged to logic low, the control and protection circuit transitions the system power enabling signal from logic low to logic high;
- at a thirteenth time point, in response to the logic high system power enabling signal transitioned from logic low to logic high, the at least one voltage converter transitions the system power signal from logic low to logic high;
- at a fourteenth time point, the system-on-chip transitions the power off signal from logic low to logic high; and
- at a fifteenth time point, in response to the logic high power off signal transitioned from logic low to logic high, the control signal generated by the control and protection circuit is transitioned from logic low to logic high, so that the electronic device is successfully boosted, and the electronic device is at a state of normal operation.

10. A protection method of an electronic device, comprising:
- detecting a voltage source to output a voltage detection signal;
- generating a system power enabling signal according to the voltage detection signal;
- generating a system power signal according to the system power enabling signal; and
- controlling the electronic device in response to the system power signal,
- wherein,
- in response to a power off signal, the voltage detection signal is isolated to avoid transition of the voltage detection signal affecting a system shutdown procedure of the electronic device.

11. The protection method of an electronic device according to claim 10, wherein, the step of generating the system power signal according to the system power enabling signal comprises:
- receiving the system power enabling signal to generate a system bus voltage.

12. The protection method of an electronic device according to claim 11, wherein, the step of generating the system power signal according to the system power enabling signal further comprises:
- receiving the system bus voltage to generate the system power signal.

13. The protection method of an electronic device according to claim 10, wherein,
during a first stage,
- at a first time point, the voltage source is transitioned from logic low to logic high to output the logic high voltage detection signal;
- at a second time point, a logic high system power enabling signal is generated according to the logic high voltage detection signal;
- at a third time point, the logic high system power signal is generated, so that the electronic device can perform a normal operation;
- at a fourth time point, a logic high power off signal is generated, and the voltage detection signal is isolated to avoid the transition of the voltage detection signal affecting the system shutdown procedure of the electronic device; and
- at a fifth time point, in response to a logic high power off signal, a logic high control signal is generated.

14. The protection method of an electronic device according to claim 13, wherein, during a second stage,
- at a sixth time point, the voltage source is transitioned from logic high to logic low;
- at a seventh time point, the voltage source is transitioned from logic low to logic high;
- at an eighth time point, when the system shutdown procedure is completed, and the power off signal is transitioned from logic high to logic low;
- at a ninth time point, in response to the power off signal transitioned from logic high to logic low, the system power enabling signal is transitioned from logic high to logic low;
- at a tenth time point, in response to the system power enabling signal transitioned from logic high to logic low, the system power signal is transitioned from logic high to logic low; and
- at an eleventh time point, the logic high control signal is gradually discharged to logic low.

15. The protection method of an electronic device according to claim 14, wherein, during a third stage,
- at a twelfth time point, when the control signal is discharged to logic low, the system power enabling signal is transitioned from logic low to logic high;
- at a thirteenth time point, in response to the logic high system power enabling signal transitioned from logic low to logic high, the system power signal is transitioned from logic low to logic high;
- at a fourteenth time point, the power off signal is transitioned from logic low to logic high; and
- at a fifteenth time point, in response to the logic high power off signal transitioned from logic low to logic high, the control signal generated by the control and protection circuit is transitioned from logic low to logic high, so that the electronic device is successfully boosted, and the electronic device is at a state of normal operation.

16. An electronic device, comprising:
- a voltage detection circuit configured to detect a voltage source to output a voltage detection signal;
- a control and protection circuit coupled to the voltage detection circuit and configured to generate a system power enabling signal according to the voltage detection signal;
- a plurality of voltage converters coupled to the control and protection circuit, wherein the plurality of voltage converters generate a system bus voltage and a system power signal according to the system power enabling signal; and a system-on-chip coupled to the plurality of voltage converters, wherein the system-on-chip, when receiving the system power signal generated by the plurality of voltage converters, controls the electronic device, wherein, in response to a power off signal generated from the system-on-chip, the control and protection circuit further isolates the voltage detection signal.

17. The electronic device according to claim 16, wherein, when performing the system shutdown procedure, the system-on-chip generates the power off signal to the control and protection circuit;

in response to the power off signal generated from the system-on-chip, the control and protection circuit isolates the voltage detection signal to avoid transition of the voltage detection signal affecting a system shutdown procedure of the electronic device.

18. The electronic device according to claim 16, wherein, during a first stage, at a first time point, the voltage source is transitioned from logic low to logic high, so that the voltage detection circuit outputs the logic high voltage detection signal;

at a second time point, the control and protection circuit generates the logic high system power enabling signal according to the logic high voltage detection signal;

at a third time point, the at least one voltage converter generates the logic high system power signal to the system-on-chip, so that the electronic device can perform a normal operation;

at a fourth time point, the system-on-chip generates a logic high power off signal to the control and protection circuit; in response to the power off signal generated from the system-on-chip, the control and protection circuit isolates the voltage detection signal to avoid the transition of the voltage detection signal affecting the system shutdown procedure of the electronic device; and at a fifth time point, in response to the logic high power off signal generated from the system-on-chip, the control and protection circuit generates a logic high control signal.

19. The electronic device according to claim 18, wherein, during a second stage, at a sixth time point, the voltage source is transitioned from logic high to logic low;

at a seventh time point, the voltage source is transitioned from logic low to logic high;

at an eighth time point, when the system shutdown procedure is completed, the system-on-chip transitions the power off signal from logic high to logic low;

at a ninth time point, in response to the power off signal transitioned from logic high to logic low, the control and protection circuit transitions the system power enabling signal from logic high to logic low;

at a tenth time point, in response to the system power enabling signal transitioned from logic high to logic low, the at least one voltage converter transitions the system power signal from logic high to logic low; and at an eleventh time point, the logic high control signal generated by the control and protection circuit is gradually discharged to logic low.

20. The electronic device according to claim 19, wherein, during a third stage, at a twelfth time point, when the control signal is discharged to logic low, the control and protection circuit transitions the system power enabling signal from logic low to logic high;

at a thirteenth time point, in response to the logic high system power enabling signal transitioned from logic low to logic high, the at least one voltage converter transitions the system power signal from logic low to logic high;

at a fourteenth time point, the system-on-chip transitions the power off signal from logic low to logic high; and at a fifteenth time point, in response to the logic high power off signal transitioned from logic low to logic high, the control signal generated by the control and protection circuit is transitioned from logic low to logic high, so that the electronic device is successfully boosted, and the electronic device is at a state of normal operation.

* * * * *